Feb. 28, 1950 M. WALLACE 2,498,932

HIGH-FREQUENCY TUNING CIRCUIT

Filed Aug. 18, 1944 2 Sheets-Sheet 1

INVENTOR
MARCEL WALLACE
BY Darby & Darby
ATTORNEY

HIGH-FREQUENCY TUNING CIRCUIT

Filed Aug. 18, 1944 2 Sheets-Sheet 2

INVENTOR
MARCEL WALLACE
BY Darby & Darby
ATTORNEY

Patented Feb. 28, 1950

2,498,932

UNITED STATES PATENT OFFICE 2,498,932

HIGH-FREQUENCY TUNING CIRCUIT

Marcel Wallace, New York, N. Y., assignor, by mesne assignments, of one-half to Panoramic Radio Corporation, New York, N. Y., a corporation of New York Application August 18, 1944, Serial No. 550,046

2 Claims. (Cl. 250—20)

My invention relates to high frequency resonant circuits for radio transmitters, receivers, carrier systems and the like, and particularly to electronic means for tuning the resonant circuits.

In associated tuned high frequency circuits such as cascaded resonant circuits of an amplifier or converter it is necessary, in shifting the frequency of response of the circuits, to make the several circuits track or change uniformly throughout the tuning range of the circuits. Usually this is done by interlocking or "ganging" tuning condensers or inductances on a common shaft and providing trimmer condensers for fine alignment adjustments. Ganged tuning condensers are expensive to manufacture and install and have mechanical and electrical disadvantages. For example, since the several condensers must be close together and on the same shaft or must be interlocked with elaborate gears, these condenser assemblies do not offer the flexibility of mechanical layout of the chassis and electrical design of the circuits that is desired. Moreover, the usual tuning condensers do not readily lend themselves to remote control. Mechanical tuning, further, has disadvantages in circuits that must be rapidly and periodically varied over a frequency band as in the scanning circuits of Panoramic type radio receivers.

An object of my invention is improved means for tuning high frequency resonant circuits.

Another object of my invention is to obviate the mechanical and electrical disadvantages of the usual ganged tuning elements.

Another and more specific object of my invention is tuning means for resonant circuits that may be easily controlled remotely.

Still another object of my invention is to provide a Panoramic receiving system, allowing electronic tuning of a plurality of tuned stages.

One embodiment of my invention comprises essentially a plurality of coupled resonant circuits, such as are commonly used in radio transmitters or receivers with at least one adjustable tuning element in each of the circuits. A plurality of electron discharge devices, each having an anode, a cathode and a grid electrode, are connected in the resonant circuits with the anode-cathode spaces of the devices being part of the reactance of the tuning elements. An out-of-phase component of space current is made variable in amplitude with adjustable cathode or anode potentials to determine the effective reactance of the discharge devices in the resonant circuits. Each resonant circuit may then be tuned by varying the cathode or anode potential of each of the electron discharge devices, called reactor tubes, and conveniently, the grids may be connected together and to a common variable biasing source, through the necessary isolating means.

Figure 1:
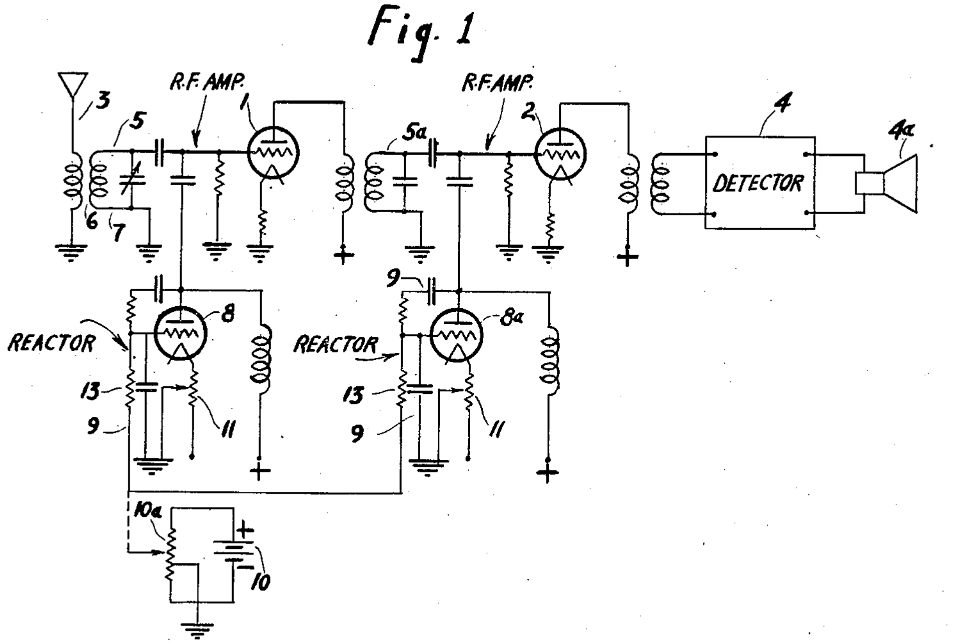
Figure 2:
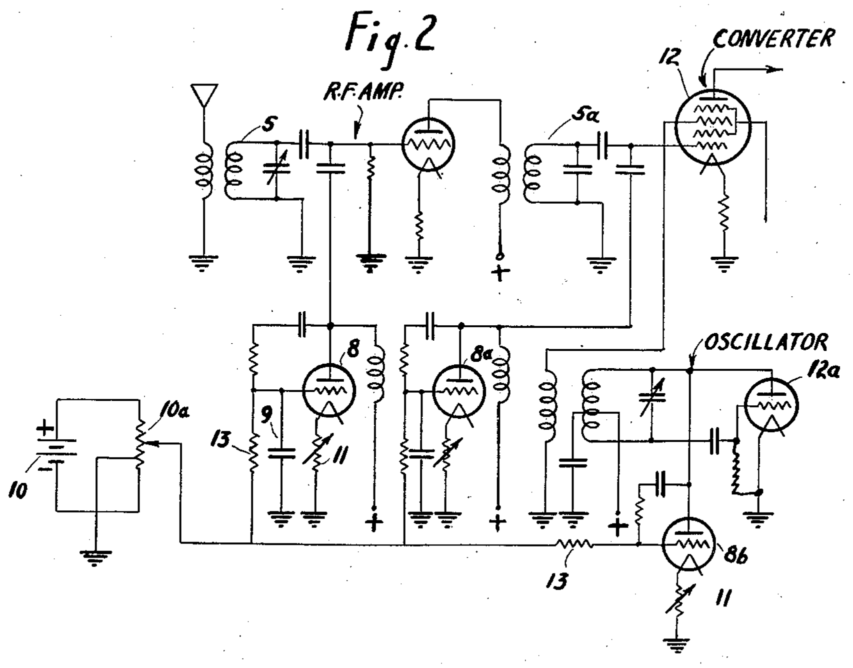
Figure 3:
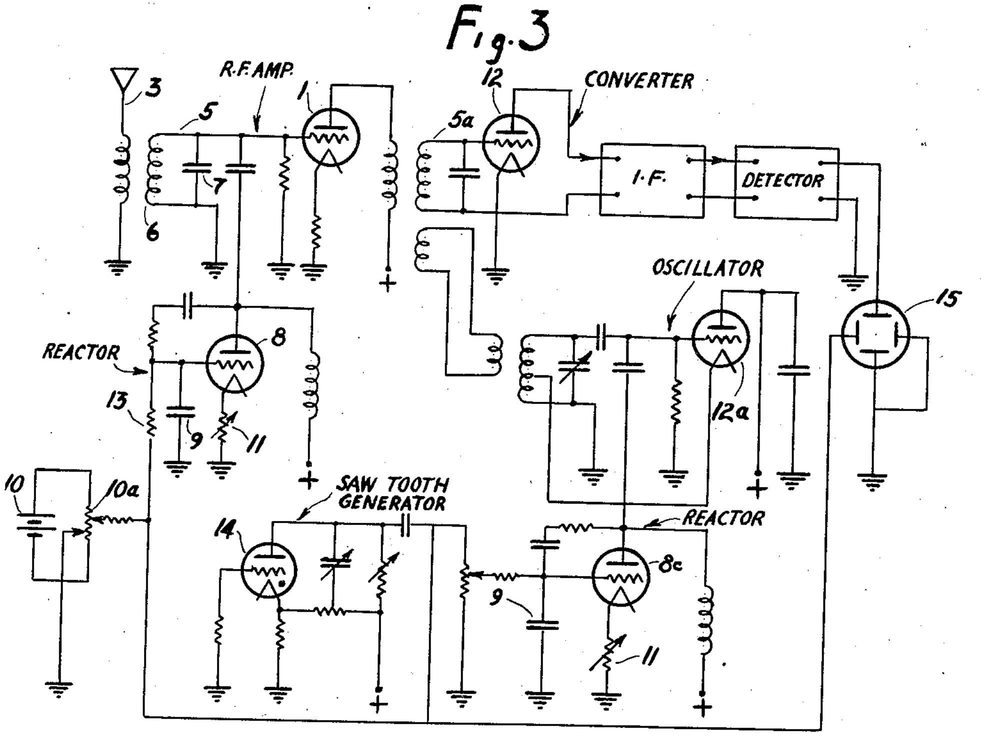

My invention is defined with particularity in the appended claims and preferred embodiments thereof are described in the following specification and shown in the accompanying drawing in which, Figure 1 shows schematically a tuned radio frequency amplifier embodying my novel tuning means, Figure 2 shows schematically a superheterodyne type receiver embodying my invention, and Figure 3 shows schematically a Panoramic receiver with interconnected reactor tubes in the radio frequency circuits and in the oscillator circuits.

A tuned radio frequency receiver is shown by way of example to illustrate the characteristic features of my novel tuning system. In Figure 1 radio frequency amplifier tubes 1 and 2 are transformer coupled in the usual way between a signal receiving circuit such as antenna 3 and the detector 4. The utilization circuit may be connected to a loudspeaker 4_a_. Each tunable circuit, 5 and 5_a_, contains the usual parallel inductance 6, and condenser 7. The resonant frequency of the circuits may, of course, be varied by varying the inductive and/or capacitive reactance in the circuits. According to my invention, effective reactance variations are accomplished by connecting a load which acts like a reactance by virtue of the fact that the current through this load is out of phase with the voltage. The out-of-phase currents may be derived from a triode or any electron discharge device, with a grid or space current control element, connected across the reactance of the circuit to be tuned. The electron discharge devices so connected, in the drawing, are designated by the references 8 and 8_a_. With respect to the time phase of signal current through tank, 5, Figure 1, the voltage across condenser 9 (which may be the grid cathode capacity), and of tube 8, is 90 degrees leading, and, because of the voltage phase reversal of tube 8, the voltage of the plate of tube 8 is 90 degrees lagging. The sum of the tank current and the reactor plate current determines the apparent reactance, and hence frequency, of the tank circuit. It follows that the relative values of these two currents may be varied by varying the trans-conductance of tube 8, which conveniently is varied by the grid bias. Tubes 8, 8a, 8b and 8c will, accordingly, be hereinafter referred to as reactor tubes.

According to the principal feature of my invention, the grids of the reactor tubes 8 and 8a in the tank circuits 5 and 5a are connected together through resistors 13, and to a common adjustable biasing source shown schematically in Figure 1 as a battery 10 across a potentiometer 10a which, now, becomes a tuning element for the RF circuits. The potentiometer 10a may be grounded intermediate its ends, so that the grid potential may be variable from any desired negative value to any desired positive value. The two reactor tubes 8 and 8a may be trimmed or adjusted to corresponding resonant values by adjusting the cathode resistors 11. If the several reactor tubes have like grid voltage-plate current characteristics, like grid potential changes will produce like frequency shifts in the resonance of the several tank circuits.

The tuning sytem of my invention is admirably adapted to remote control. A cable carrying the low voltage direct current of the reactor biasing circuit, may be of any desired length.

One of the frequency selecting circuits may comprise means for converting the carrier frequency to a higher or lower frequency as in a superheterodyne receiver and as shown schematically in Figure 2. Here reactor tubes 8 and 8a tune the radio frequency circuits 5 and 5a, while reactor tube 8b tunes the heterodyne oscillator 12a, the output of which is mixed with the carrier in converter tube 12. The oscillator and the radio frequency tuning circuits may be made to track by connecting the grids of the reactor tubes 8, 8a and 8b through de-coupling resistors 13 to the common biasing source 10. As in Figure 1, alignment of the radio frequency and oscillator circuits may be easily obtained by adjustment of the cathode resistors of the reactor tubes.

In the Panoramic type of superheterodyne receiver, the local oscillator as well as the tuned input circuits may be periodically tuned over a predetermined frequency band in synchronism with the sweep voltage of a cathode ray tube oscilloscope. It is desirable in such receivers to simultaneously shift the band scanned by the oscillator and the resonant frequency of the radio frequency tuning circuits, so that the RF resonance always tracks the oscillator at a frequency difference equal to the frequency of the intermediate frequency amplifier.

In the circuit of Figure 3, the frequency of heterodyne oscillator 12a is determined by the reactor tube 8c. The grid potential of the reactor tube is made to rise and fall by a voltage wave of sawtooth shape obtained from the conventional sawtooth wave generator including gas tube 14. The band of frequencies periodically scanned by the oscillator is shifted by varying the static bias of the reactor tube grid. If the R. F. reactor tuning tube 8 is provided with grid bias in parallel with the grid bias of reactor tube 8c, the RF tuning will always track in the center of the scanned band. By applying voltages to one pair of deflection plates of the cathode ray tube 15 for each carrier as it is successively tuned in, and by applying a sweep voltage from the sawtooth generator 14 to the other pair of plates, all the signals received in the scanned band may be made to simultaneously appear on the screen of the cathode ray tube.

While the specific examples described above are radio receiving circuits, it is apparent that my invention may be applied to any transmitting or carrier wave circuits where tuning elements of the resonant circuits must be tracked or interlocked. My invention obviates the mechanical and electrical disadvantages of the usual ganged tuning elements, is inexpensive to manufacture and is easy to operate.

I claim:

1. A translating circuit, comprising, a plurality of amplifier tubes coupled by tuned radio frequency transformers having windings, tuning condensers connected across the windings of said transformers, means to adjust the resonant frequencies of said windings comprising grid controlled electron discharge devices each having a cathode, an anode and a control grid, said electron discharge devices connected across the ends of said windings, respectively, means for shifting the phase of the operating voltage at one end of each winding and applying the phase shifted voltage to the grid of the connected electron discharge device, a common adjustable biassing source for the grids of all said discharge devices, an unby-passed resistor in the cathode circuit of each of said electron discharge devices, and means for individually varying said resistors.

2. A translating circuit comprising a plurality of coupled resonant circuits, a tuning element in each of said circuits, a plurality of electron discharge devices, each having a plurality of electrodes including an anode, a cathode and a grid, the anodes and cathodes of said devices being respectively connected in circuit with said tuning elements, a phase shifting circuit for transferring energy from the anode to the grid of each of said devices to cause said devices each to simulate a reactance, first means for simultaneously varying the potential of one of said electrodes of each of said devices to vary simultaneously the values of simulated reactances of said devices, and further means for individually varying the simulated reactances of said devices, said further means comprising an unbypassed resistor connected in the cathode circuit of each of said electron discharge devices, and means for individually varying said resistances.

MARCEL WALLACE.

REFERENCES CITED

The following references are of record in the file of this patent:

UNITED STATES PATENTS

| Number | Name | Date |
|---|---|---|
| 2,007,253 | MacDonald | July 9, 1935 |
| 2,056,011 | Lowell | Sept. 29, 1936 |
| 2,077,126 | O'Brien | Apr. 13, 1937 |
| 2,256,070 | Weagant | Sept. 16, 1941 |
| 2,265,016 | White | Dec. 2, 1941 |
| 2,280,527 | Kimball | Apr. 21, 1942 |
| 2,282,103 | Tunick | May 5, 1942 |
| 2,287,925 | White | June 30, 1942 |
| 2,323,598 | Hathaway | July 6, 1943 |
| 2,357,984 | Travis | Sept. 12, 1944 |
| 2,361,731 | Bach | Oct. 31, 1944 |
| 2,397,842 | Crosby | Apr. 2, 1946 |